US005539697A

United States Patent [19]
Kim et al.

[11] Patent Number: 5,539,697
[45] Date of Patent: Jul. 23, 1996

[54] METHOD AND STRUCTURE FOR USING DEFECTIVE UNREPAIRABLE SEMICONDUCTOR MEMORY

[75] Inventors: Timothy Kim, Milpitas; Hak J. Kim, Santa Clara, both of Calif.

[73] Assignees: Bi-Search Corporation, San Jose, Calif.; Tae Il Media Co., Ltd., Kyunggi-Do, China

[21] Appl. No.: 285,377

[22] Filed: Aug. 3, 1994

[51] Int. Cl.⁶ .................. G11C 29/00; G06F 12/00
[52] U.S. Cl. .......... 365/200; 371/10.2; 365/230.01; 365/230.06; 395/412; 395/410
[58] Field of Search .................. 371/10.1, 10.2; 365/200, 201, 230.01, 230.06; 395/410, 412

[56] References Cited

U.S. PATENT DOCUMENTS

| | | | |
|---|---|---|---|
| 5,239,656 | 8/1993 | Kawano | 395/800 |
| 5,253,350 | 10/1993 | Foster et al. | 395/400 |
| 5,359,570 | 10/1994 | Hsu et al. | 371/10.2 |

FOREIGN PATENT DOCUMENTS 0031624  3/1977  Japan.

OTHER PUBLICATIONS

"Improved RAS by Segmenting Memory Using a SRAM and Reserved Area Defective Memory Relocation," IBM TDB, vol. 30, No. 12, May 1988 pp. 204–208.

Primary Examiner—Viet Q. Nguyen
Attorney, Agent, or Firm—Skjerven, Morrill, MacPherson Franklin & Friel; Forrest E. Gunnison

[57] ABSTRACT

An apparatus utilizing a semiconductor memory includes a semiconductor memory with one or more permanent unrepairable defects. The use of defective semiconductor memory that was previously discarded significantly reduces the memory cost of the apparatus. A memory mapping circuit is used to convert an address for a defective memory location within the defective semiconductor memory to an address for a working memory location. The memory mapping circuit is transparent to the apparatus and the defective memory functions as an undefective memory. Consequently, an apparatus using the memory mapping circuit and the defective memory performs as apparatus with a memory that has no unrepairable defects.

20 Claims, 11 Drawing Sheets

| Input Address | Mapping Address | Translated Address |
|---|---|---|
| 0Fh | 06 | 15h |
| 0Eh | 06 | 14h |
| 0Dh | 05 | 12h |
| 0Ch | 05 | 11h |
| 0Bh | 04 | 0Fh |
| 0Ah | 04 | 0Eh |
| 09h | 04 | 0Dh |
| 08h | 04 | 0Ch |
| 07h | 04 | 0Bh |
| 06h | 03 | 09h |
| 05h | 02 | 07h |
| 04h | 01 | 05h |
| 03h | 01 | 04h |
| 02h | 01 | 03h |
| 01h | 00 | 01h |
| 00h | 00 | 00h |

FIG. 2B

| Input Address | Mapping Address | Translated Address |
|---|---|---|
| 0Fh | 15h | 15h |
| 0Eh | 14h | 14h |
| 0Dh | 12h | 12h |
| 0Ch | 11h | 11h |
| 0Bh | 0Fh | 0Fh |
| 0Ah | 0Eh | 0Eh |
| 09h | 0Dh | 0Dh |
| 08h | 0Ch | 0Ch |
| 07h | 0Bh | 0Bh |
| 06h | 09h | 09h |
| 05h | 07h | 07h |
| 04h | 05h | 05h |
| 03h | 04h | 04h |
| 02h | 03h | 03h |
| 01h | 01h | 01h |
| 00h | 00h | 00h |

FIG. 2C

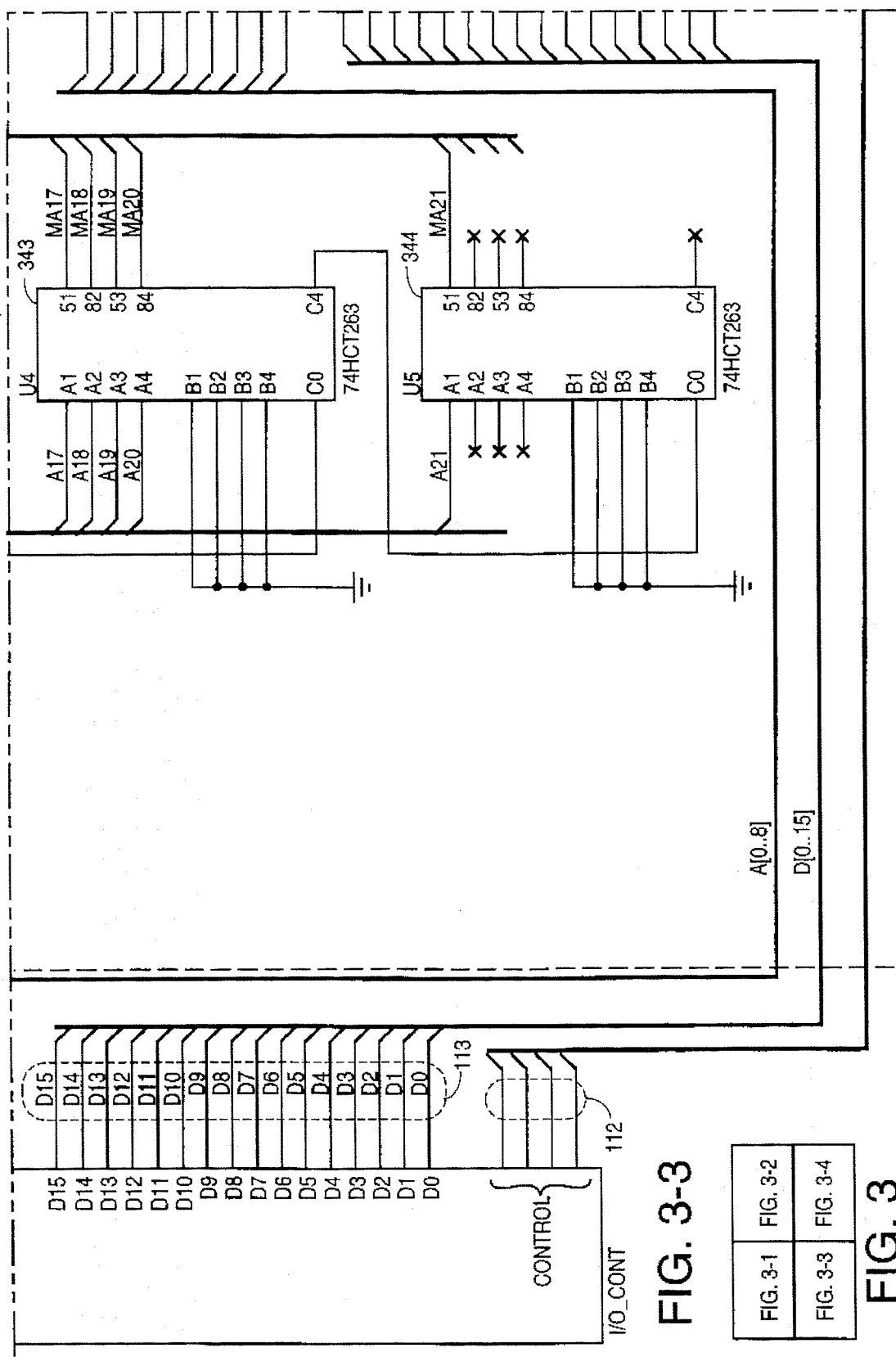

METHOD AND STRUCTURE FOR USING DEFECTIVE UNREPAIRABLE SEMICONDUCTOR MEMORY

BACKGROUND OF THE INVENTION

1. Field of the Invention

This invention relates generally to an apparatus that utilizes semiconductor memory and in particular to an apparatus that utilizes semiconductor memory where the semiconductor memory has one or more permanent unrepairable defects.

2. Description of Related Art

A wide variety of devices utilize memory for storage of information. For example, most computers include a disk drive as well as semiconductor read-only and random access memories to store information. Read-only memories used in a computer include an EPROM, an EEPROM, and a flash EEPROM, that are all semiconductor memories. Random access memory includes dynamic random access memory, static random access memory and video memory, for example. In some situations, an EEPROM and a flash EEPROM memory may be considered a random access memory also. The important aspect is that all of these memories are semiconductor memories.

A semiconductor memory typically is manufactured with redundant memory that can be used to replace defective memory cells, defective memory rows, and/or defective memory columns. For example, if a column of memory is defective, the defective column is replaced by a column within the redundant memory and the memory is sold as a defect free memory. However, if a semiconductor memory has more defects than can be repaired using the redundant memory, the semiconductor is usually considered defective and discarded. Similarly, if a semiconductor memory does not include redundant memory and the semiconductor memory has a permanent defect, the semiconductor memory is most likely considered defective and discarded.

Although a discarded defective semiconductor memory may have a portion of the memory that is usable, the memory is not used. Thus, memory devices are relatively expensive simply because a usable memory can not have unrepairable permanent defects.

SUMMARY OF THE INVENTION

According to the principles of this invention, an apparatus utilizing a semiconductor memory includes a semiconductor memory with one or more permanent unrepairable defects. The apparatus with the defective semiconductor memory includes a memory mapping circuit that converts an address for a defective memory location to an address for a working memory location, i.e, an address for an undefective location in the defective memory. The memory mapping circuit is transparent to the apparatus and so the defective memory appears and functions as a memory without defects. Consequently, an apparatus using the memory mapping circuit and the defective memory performs as apparatus with a memory that has no unrepairable defects.

In one embodiment, the apparatus of this invention receives from a host memory I/O controller a memory address on an address bus, data on a data bus, and memory control signals. The operation of the host memory I/O controller is well-known to those skilled in the art.

The memory address on the address bus, the data on the data bus, and the control signals are input signals to a defective memory address translation circuit of this invention. The memory address translation circuit includes a mapping table that generates a mapping address in response to the memory address from the host memory I/O controller. In one embodiment, the mapping table includes one entry for each possible address from the host memory I/O controller. The mapping address is combined with the memory address from the memory controller by the memory address translation circuit to generate a translated address. Each translated address is for a location in the defective memory that is fully functional.

The data and control signals from the host memory I/O controller are delayed for a fixed predetermined time interval in the memory address translation circuit and then applied to the defective memory. The memory address mapping requires a fixed predetermined time interval to perform the address translation. Consequently, the time delay for the control signals and data maintains the timing relationships between the various signals so that valid data is written to and read from the defective memory.

In another embodiment, each entry in the mapping table is an address for a good storage location in the defective memory, that is called a translated address. The memory address translation circuit swaps the translated address in the table for the memory address on the address bus from the host memory I/O controller. In this embodiment, the delay circuit may not be required. The important aspect is that the original relationship between the control signals, memory address, and data defined by the host memory I/O controller is maintained within acceptable tolerances by the defective memory address translation circuit of this invention.

BRIEF DESCRIPTION OF THE DRAWINGS

FIG. 2B is a representation of the operation of the defective address translation circuit of this invention that includes a mapping address that is combined with the input address to obtain a translated address.

FIG. 2C is a representation of the operation of the defective address translation circuit of this invention where the mapping address is the translated address.

DETAILED DESCRIPTION

According to the principles of this invention, an apparatus utilizing a semiconductor memory includes a semiconductor memory with one or more permanent unrepairable defects. The use of defective semiconductor memory, that was previously discarded, significantly reduces the memory cost of the apparatus. In the apparatus of this invention, a memory mapping circuit is used to convert an address for a defective memory location to an address for a working memory location. The memory mapping circuit is transparent to the apparatus and so the defective memory appears and functions as an undefective memory. Consequently, an apparatus using the memory mapping circuit and the defective memory performs as apparatus with a memory that has no unrepairable defects.

Figure 1:
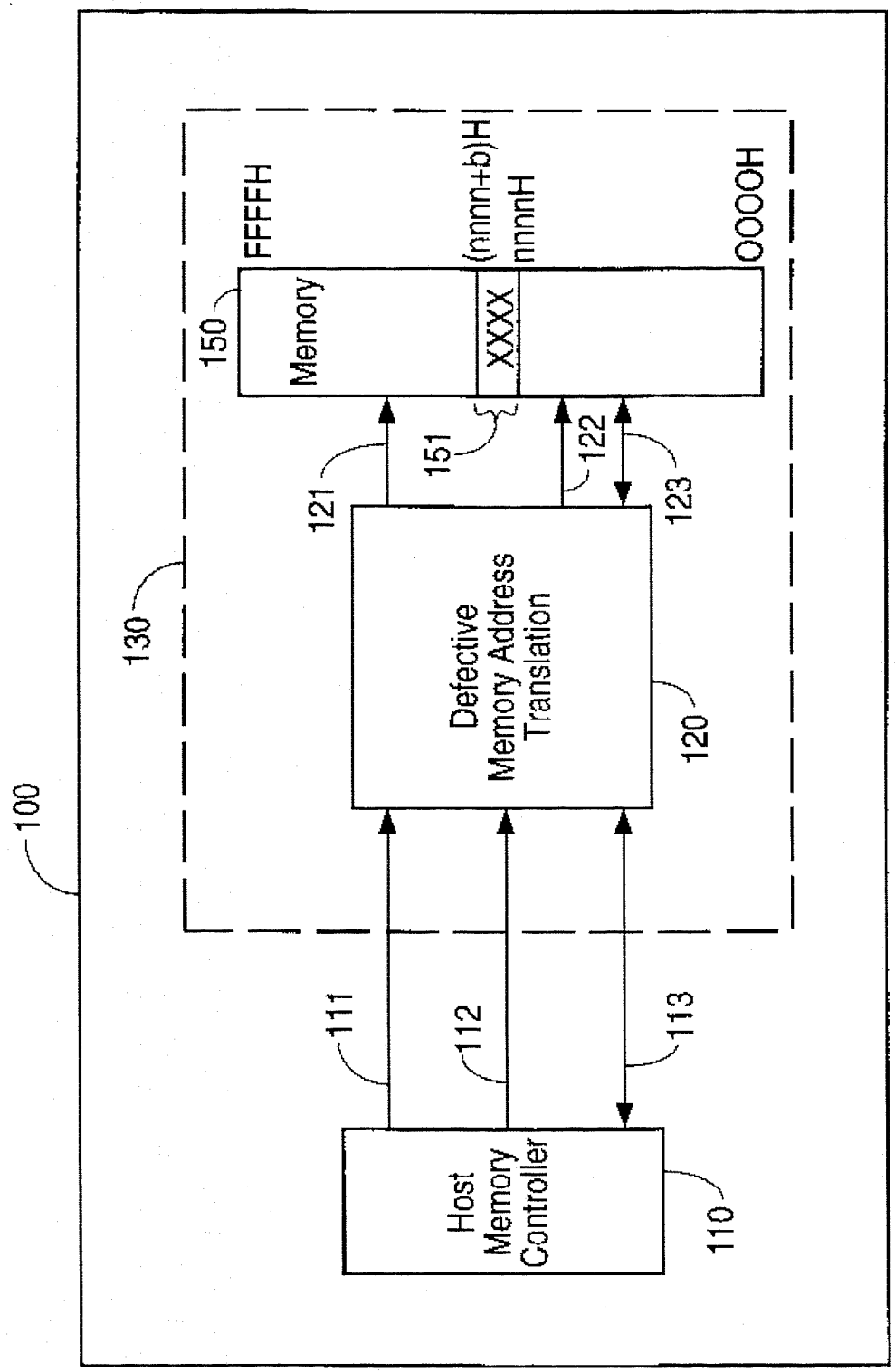
FIG. 1 is a block diagram that utilizes a memory with permanent unrepairable defects according to the principles of this invention.

FIG. 1 is a block diagram of one embodiment of an apparatus 100 utilizing a semiconductor memory 150 with a permanent unrepairable memory defect 151. The location of the defect within semiconductor memory is known because any permanent defective areas can be identified by routine testing of semiconductor memory 150. In this example, memory 150 has a single defect of size b that starts at address nnnnh. The defect is permanent and cannot be repaired using redundant memory within the memory integrated circuit containing the defective memory. A host memory I/O controller 110 in apparatus 100 supplies a memory address on address bus 111, data on data bus 113, and control signals on control lines 112. The operation of a host memory I/O controller 110 is well-known to those skilled in the art.

The memory address on address bus 111, data on data bus 113, and control signals on lines 112 are input signals to a defective memory address translation circuit 120 of this invention within memory structure 130. Defective memory address translation circuit 120 converts the memory address from host memory I/O controller 110 to a translated address for defective memory 150.

In one embodiment, defective memory address translation circuit 120 adds zero to addresses less than nnnnh and adds b to addresses equal to and greater than nnnnh to obtain a translated address. The translated address is applied to defective memory 150 over translated address bus 121.

The data and control signals on data bus 113 and lines 112, respectively, are delayed for a fixed time interval in defective memory address translation circuit 120 and then applied to defective memory 150 over delayed data bus 123 and delayed control lines 122, respectively. In this embodiment, the memory address mapping within circuit 120 requires a fixed predetermined time interval. Consequently, the time delay for the control signals and data maintains the timing relationships between the various signals so that valid data is written to and read from defective memory 150.

In another embodiment, defective memory address translation circuit 120 stores a translated address for each address that can be received from host memory I/O controller 110. In response to an address on address bus 111, defective memory address translation circuit 120 retrieves the translated address for that address. The translated address is applied to memory 150 over translated address bus 121.

In this embodiment, if a fast memory is used to store the translated addresses, e.g., a memory with a five nanosecond or less delay, defective memory address translation circuit 120 does not delay the control and data signals. Rather, the control and data signals from host memory I/O controller 110 are passed directly to delayed control lines 122 and delayed data bus 123, respectively. Alternatively, if the memory used to store the translated addresses has more than about a five nanosecond delay, defective memory address translation circuit 120 delays the control and data signals as described above.

Figure 2A:
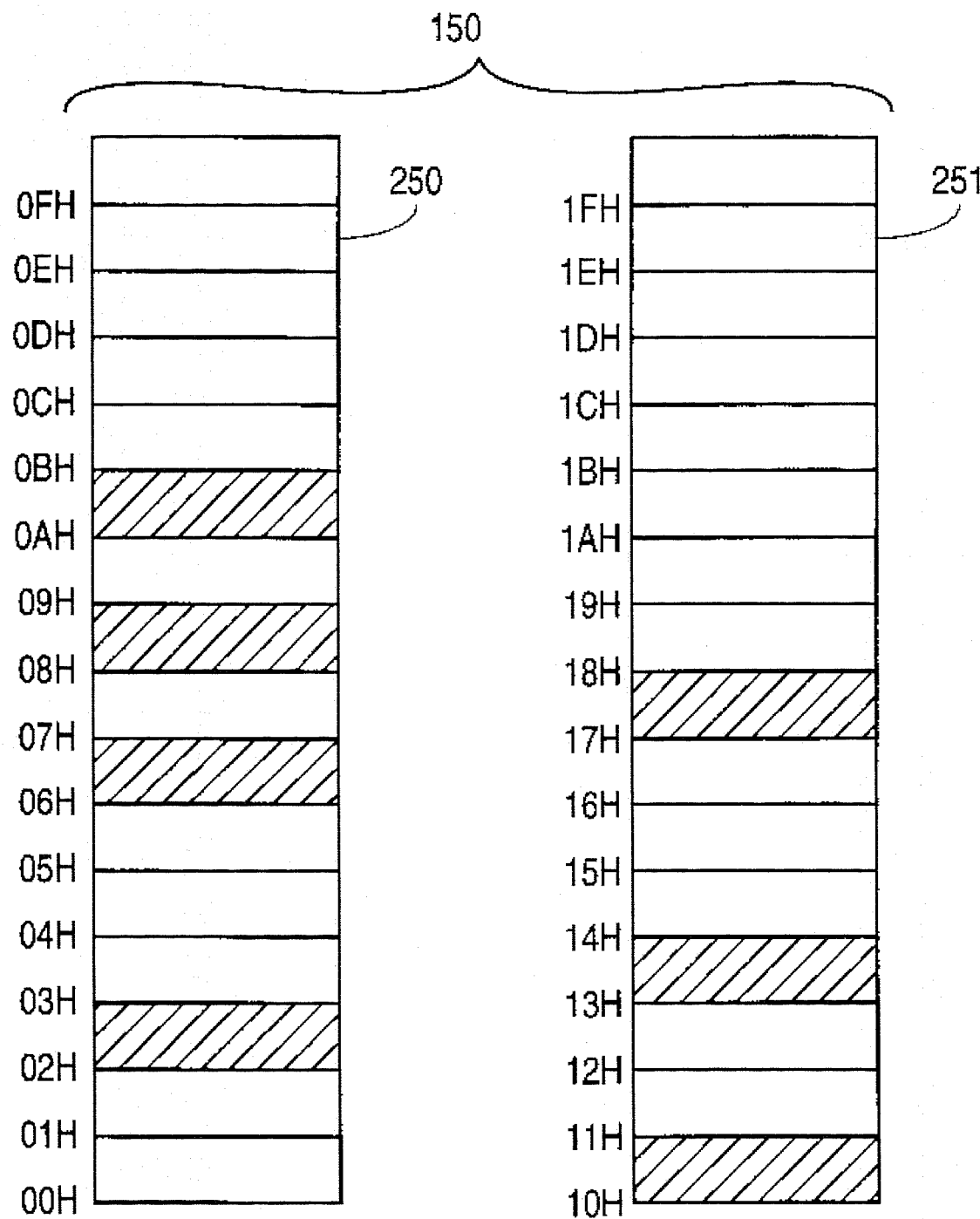
FIG. 2A is a representation of a memory with permanent unrepairable defects that is used in this invention.

FIG. 2A is an example of two sixteen byte memories with several permanent unrepairable defects which are one embodiment of defective unrepairable memory 150 (FIG. 1). Bytes 02h, 06h, 08h and 0Ah are defective in memory 250 (FIG. 2A). Bytes 10h, 13h and 17h are defective in memory 251. The defective bytes are represented in FIG. 2A by the cross-hatched locations. Apparatus 100 in this embodiment requires a sixteen byte memory and so host memory I/O controller 110 provides input addresses 00h to 0Fh as shown in column INPUT ADDRESS of FIG. 2B.

In this embodiment, defective memory address translation circuit 120 is programmed to contain the mapping address listed in column MAPPING ADDRESS of FIG. 2B, i.e, defective memory address translation circuit 120 stores the mapping addresses. To generate the translated address in column TRANSLATED ADDRESS of FIG. 2B, defective memory address translation circuit 120 uses the address on address bus 111 as an entry into a look-up table to retrieve the mapping address. Defective memory address translation circuit 120 adds the retrieved mapping address to the input address to obtain the translated address. Notice that each address from host memory I/O controller 110 is mapped by defective memory address translation circuit 120 to a good storage location within defective memories 250 and 251. Although two memories 250 and 251 are required to achieve the desired memory capacity, the memory cost including defective memory address translation circuit 120 is less than the cost of one defect free memory. In addition, memory is effectively utilized that was previously considered essentially worthless, i.e, having only a scrap value.

Those skilled in the art will appreciate that a wide variety of methods can be used to access an entry in the look-up table within circuit 120. The address itself can be used. Certain parts of the address can be used as a pointer or perhaps, the address can be combined with another address to generate a pointer. Similarly, the value retrieved from the look-up table can be combined with the address in a variety of ways to obtain the translated address. For example, the address can be added to the mapped address, as explained above. The address can be concatenated with the mapped address to generate a translated address. Alternatively, the address could be subtracted from the mapped address to generate a pointer which is the translated address. The particular way the address and the mapped address are combined depends on the addressing scheme used for defective memory 150. The important aspect is that defective memory address translation circuit 120 maps each input address to a translated address so that only those locations in defective memory 150 that in fact are undefective are utilized.

FIG. 2C illustrates the alternative embodiment of this invention. In this embodiment, defective memory address translation circuit 120 is programmed to contain the translated addresses listed in column MAPPING ADDRESS of FIG. 2C, i.e, defective memory address translation circuit 120 stores the translated addresses. To generate the translated address in column TRANSLATED ADDRESS of FIG. 2B, defective memory address translation circuit 120 uses the input address on address bus 111 as an entry into a look-up table to retrieve the mapping address, which in this embodiment is the translated address. Defective memory address translation circuit 120 drives the retrieved translated address onto translated address bus 121.

Figures 1, 3:
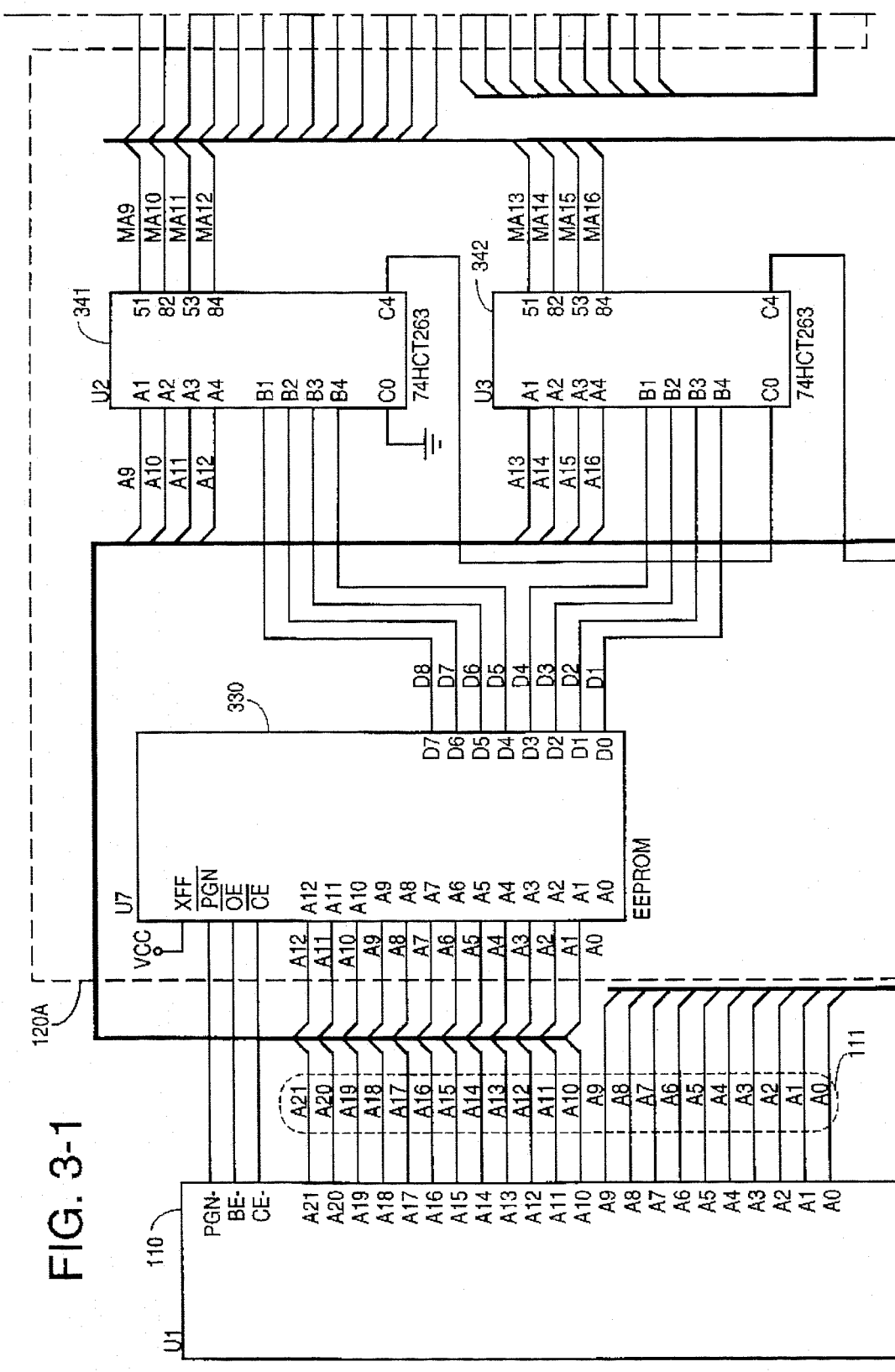
FIG. 3 is a key to FIGS. 3-1, 3-2, 3-3 and 3-4, which are a detailed diagram of one embodiment of the defective address translation circuit of this invention.
Figures 2, 3:
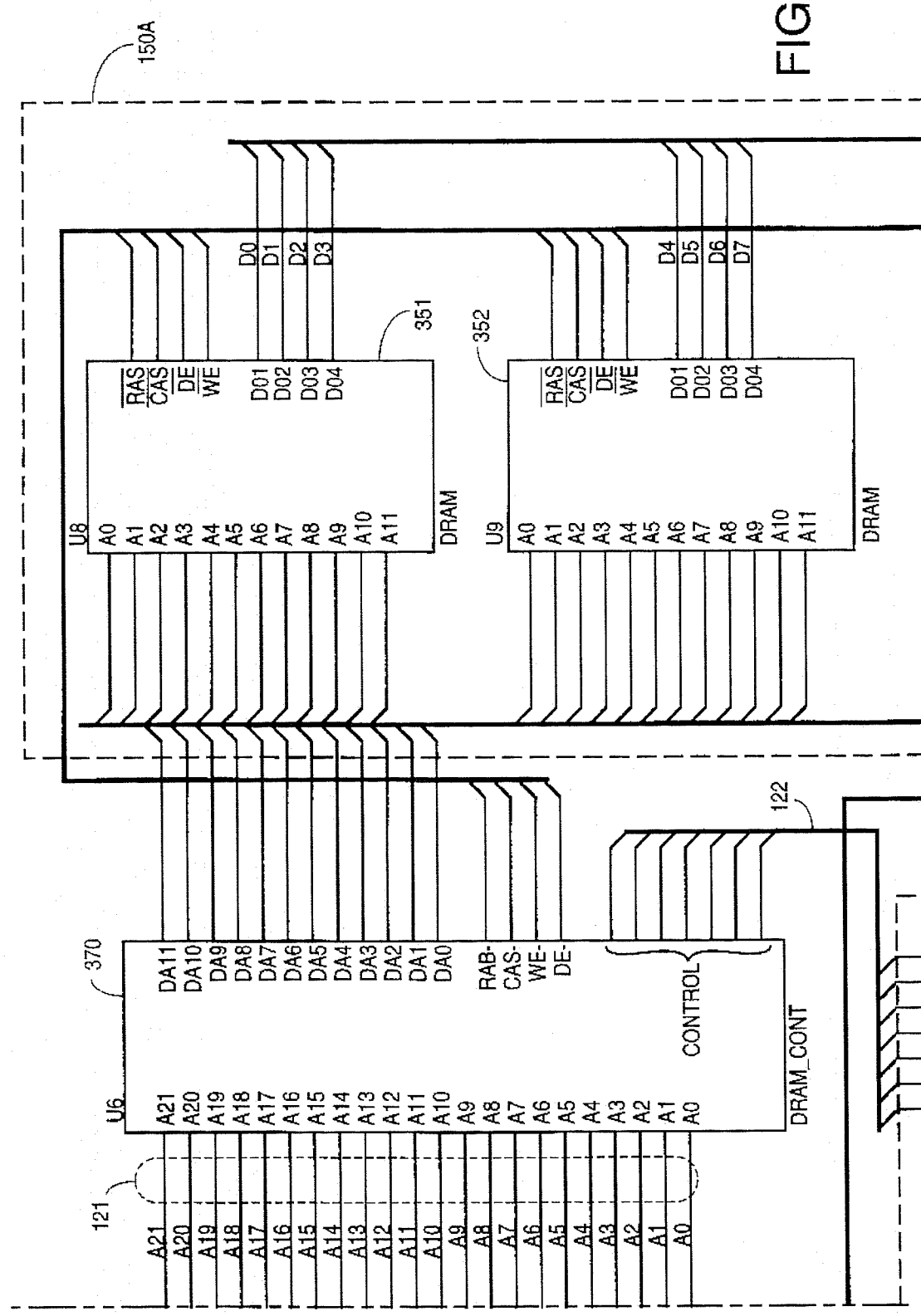
Figures 3, 4:
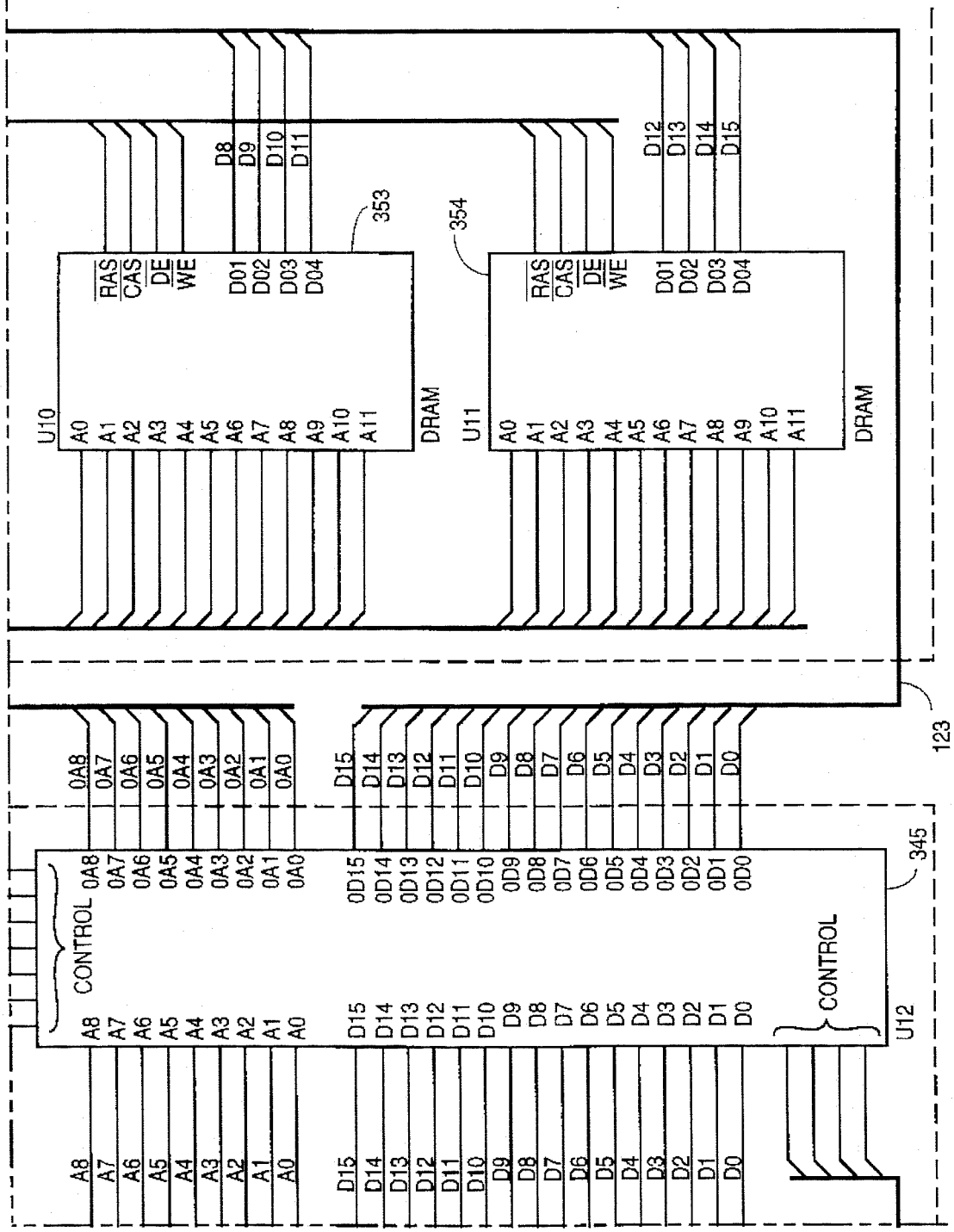

FIG. 3 is a schematic diagram illustrating an embodiment of this invention that can be used on a PCMCIA memory card. Host memory I/O controller 110 has a 22-bit address bus 111 and an 16-bit data bus 113. Typically, a PCMCIA memory cards contains in the range of one Megabyte to about 64 Megabytes. In FIG. 3, only the alterations to a standard PCMCIA memory card to use unrepairable defective memory 150A are illustrated. The general features for configuring a semiconductor memory on the PCMCIA bus are known to those skilled in the art and so are not an essential feature of this invention.

In this embodiment, defective memory 150A is dynamic random access memory DRAM 351 to 354 that is addressed in 512 byte blocks. Consequently, the first nine-bits A0 to A8 of the address, i.e., the nine least significant bits, from host memory I/O controller 110 are used to specify the relative location within a memory block. Thus, defective portions of memory 150A are defined in terms of 512 byte blocks, rather than as discrete storage locations as in FIGS. 2A to 2C.

The thirteen most significant bits, i.e., bits A9 to A21, of the address from host memory I/O controller 110 are applied to input address terminals A0 to A12 of translation memory 330 and specify a block base address. Consequently, translation memory 330 is a 16 Kbyte memory. For each address applied to translation memory 330, a location in translation memory 330 is addressed and an 8-bit mapping address in that location is supplied on output terminals D0 to D7. With an 8-bit mapping address, up to 256 permanent unrepairable defects can be accommodated in memory 150A. In this embodiment, translation memory 330 is a flash EEPROM. However, translation memory 330 can be any type of non-volatile memory such as an EPROM, EEPROM or flash-EEPROM.

In this embodiment, the four least significant bits of the block base address from host memory I/O controller 110, i.e, address bits A9 to A12, are a first set of input signals to a first four bit adder circuit 341. The four least significant bits of the mapping address, i.e., the bits on terminals D0 to D3 of translation memory 330 are a second set of input signal to four bit adder circuit 341. The carry in terminal CIN of adder circuit 341 is grounded. Adder circuit 341 combines the two sets of four bits and supplies the resulting least significant four bits MA9 to MA12 of the translated address to terminals A9 to A12 of a DRAM controller 370 and generates a carry bit on carry out terminal COUT that is connected to a carry in terminal CIN of a second four bit adder 342.

Block base address bits A13 to A16 from host memory I/O controller 110 are a first set of input signals to second four bit adder circuit 342. The four most significant bits of the mapping address, i.e., the bits on terminals D4 to D7 of translation memory 330, are a second set of input signals to four bit adder circuit 342. Adder circuit 342 combines the four block base address bits A13 to A16 with the mapping address bits D4 to D7 and the carry signal. Four bit adder circuit 342 generates four bits MA13 to MA16 of the translated address that are applied to terminals A13 to A16 of DRAM controller 370 and generates a carry bit on carry out terminal COUT that is connected to a carry in terminal CIN of a third four bit adder 343.

Block base address bits A17 to A20 are a first set of input signals to four bit adder circuit 343. The four input terminals for a second set of input signals to four bit adder circuit 343 are grounded. Adder circuit 343 combines the four block base address bits A17 to A20 with the carry signal. Four bit adder circuit 343 generates four bits MA17 to MA20 of the translated address that are applied to terminals A17 to A20 of DRAM controller 370 and generates a carry bit on carry out terminal COUT that is connected to a carry in terminal CIN of a fourth four bit adder 344.

Block base address bit A21 is the only signal from host memory I/O controller 110 in a first set of input signals to four bit adder circuit 344. The four input terminals for a second set of input signals to four bit adder circuit 344 are grounded. Adder circuit 344 combines the block base address bit A21 with the carry signal. Four bit adder circuit 344 generates the most significant bit MA21 of the translated address that is applied to terminal A21 of DRAM controller 370.

In one embodiment, adders 341 to 344 are integrated circuit part no. 74HCT283 that is available from Philips of 1600 Huron Parkway, P.O. Box 963, Ann Arbor, Mich. 48106. A DRAM controller suitable for use in this invention is sold by National Semiconductor of Santa Clara, Calif. as part number DP8840/DP8841.

As explained previously, host memory I/O controller 110 normally sequences the relationship between the address, the data, and the control signals so that a valid address and valid data are on the busses to read from or write to the memory. However, translation memory 330 and adders 341 to 344 add a deterministic fixed delay to the time when the translated address on translated address bus 121 becomes valid. Consequently, defective memory address translation circuit 120A includes a delay circuit 345 for the data and control signals as well as the nine least significant address bits A0 to A8 so that the least significant address bits, the data, and the control signals are applied to defective memory 150A in the same relationship to the translated address as the relationship generated by host memory I/O controller 110.

In this embodiment, delay circuit 345 is simply a shift register for each signal where the number of bits in the shift register is selected so that the time delay is about the same as the time delay for the address signal through translation memory 330 and adders 341 to 344. Alternatively, delay circuit 345 can introduce a predetermined number of gate delays for each signal passed through delay circuit 345.

In the above embodiment, translation memory 330 has an eight bit output address, that is the mapping address. In another embodiment, translation memory 330 is two parallel memories 430 and 431 (FIG. 4A) and so that the mapping address, which is the translated address, from translation memory 330 on translated address bus 121 is a 16-bit address that is applied directly to defective memory 150B. In this embodiment, memories 430 and 431 are fast memories and so defective memory address translation circuit 120B does not include a delay circuit. Thus, the data on data bus 113 and the control signals on lines 112 are passed directly to defective memory 150B.

In yet another embodiment, translation memory 330 is again two parallel memories 430 and 431 (FIG. 4B) and the mapping address, which is the translated address, from translation memory 330 on translated address bus 121 is applied directly to defective memory 150C. In this embodiment, memories 430 and 431 are slower memories and so defective memory address translation circuit 120C includes a delay circuit 345C. Thus, the data on data bus 113 and the control signals on lines 112 are passed through delay circuit 345C to delayed data bus 123, and delayed controls lines 122 that in turn apply the delayed signals to defective memory 150C.

In still yet another embodiment, translation memory 330 is again two parallel memories 430 and 431 (FIG. 4C) and the mapping address from translation memory 330 is applied to adder circuit 440 along with the input address on address bus 111. Adder circuit 440 drives the translated address on translated address bus 121 is applied directly to defective memory 150D. In this embodiment, the data on data bus 113 and the control signals on lines 112 are passed through delay circuit 345D to delayed data bus 123, and delayed controls lines 122 that in turn apply the delayed signals to defective memory 150D.

Figure 4A:
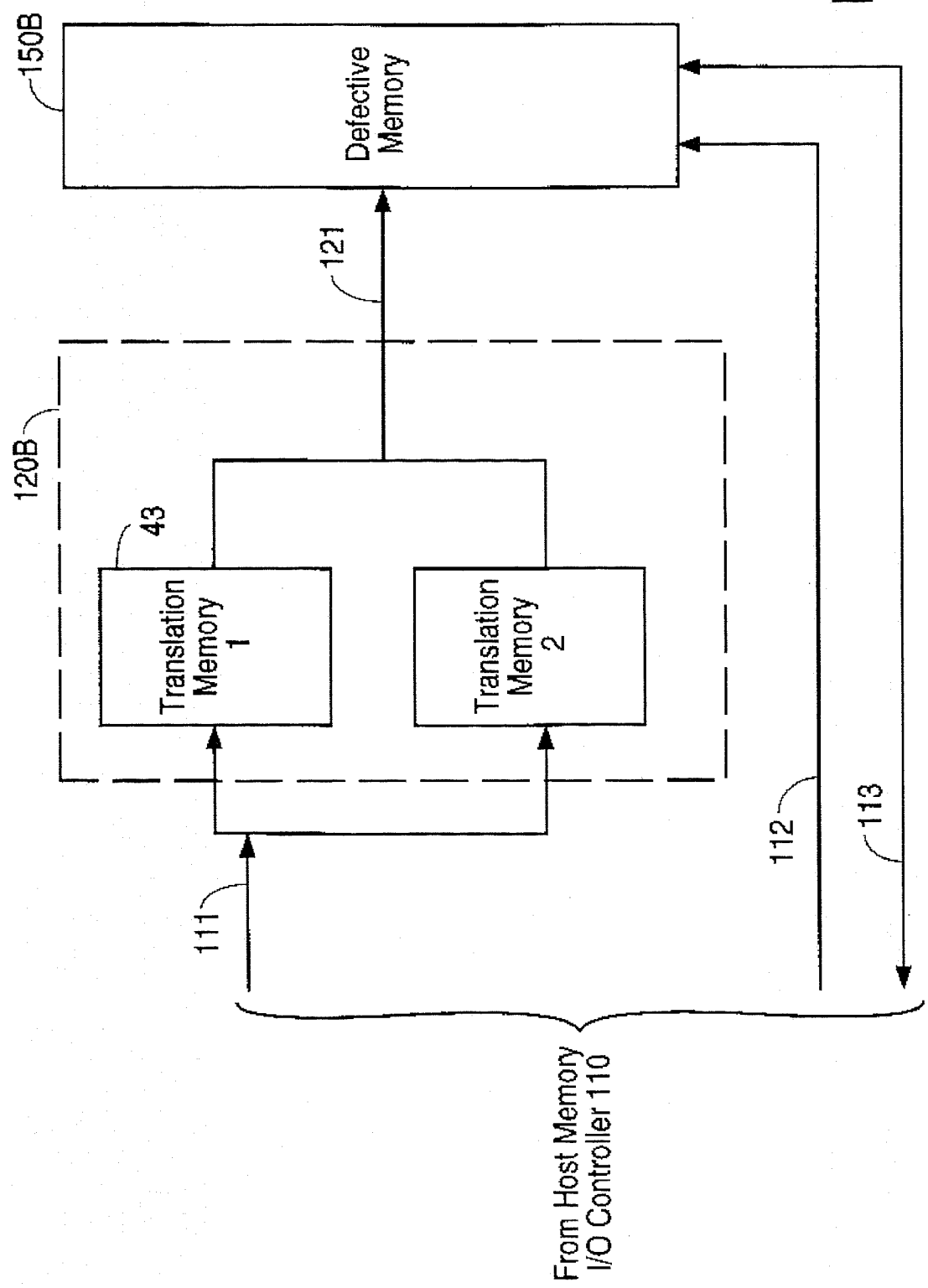
FIGS. 4A to 4C are diagrams of alternative embodiments of the defective memory address translation circuit of this invention.
Figure 4B:
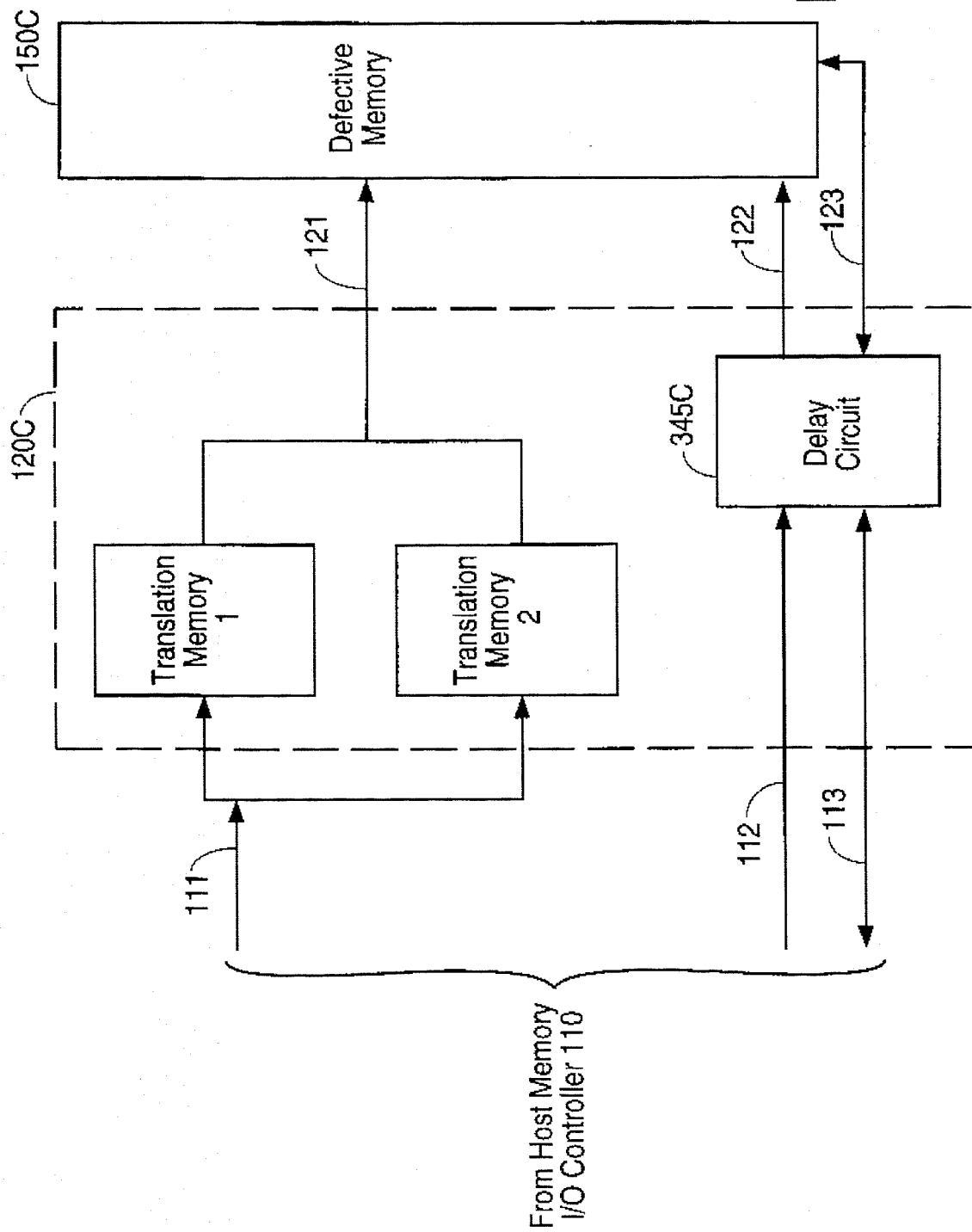
Figure 4C:
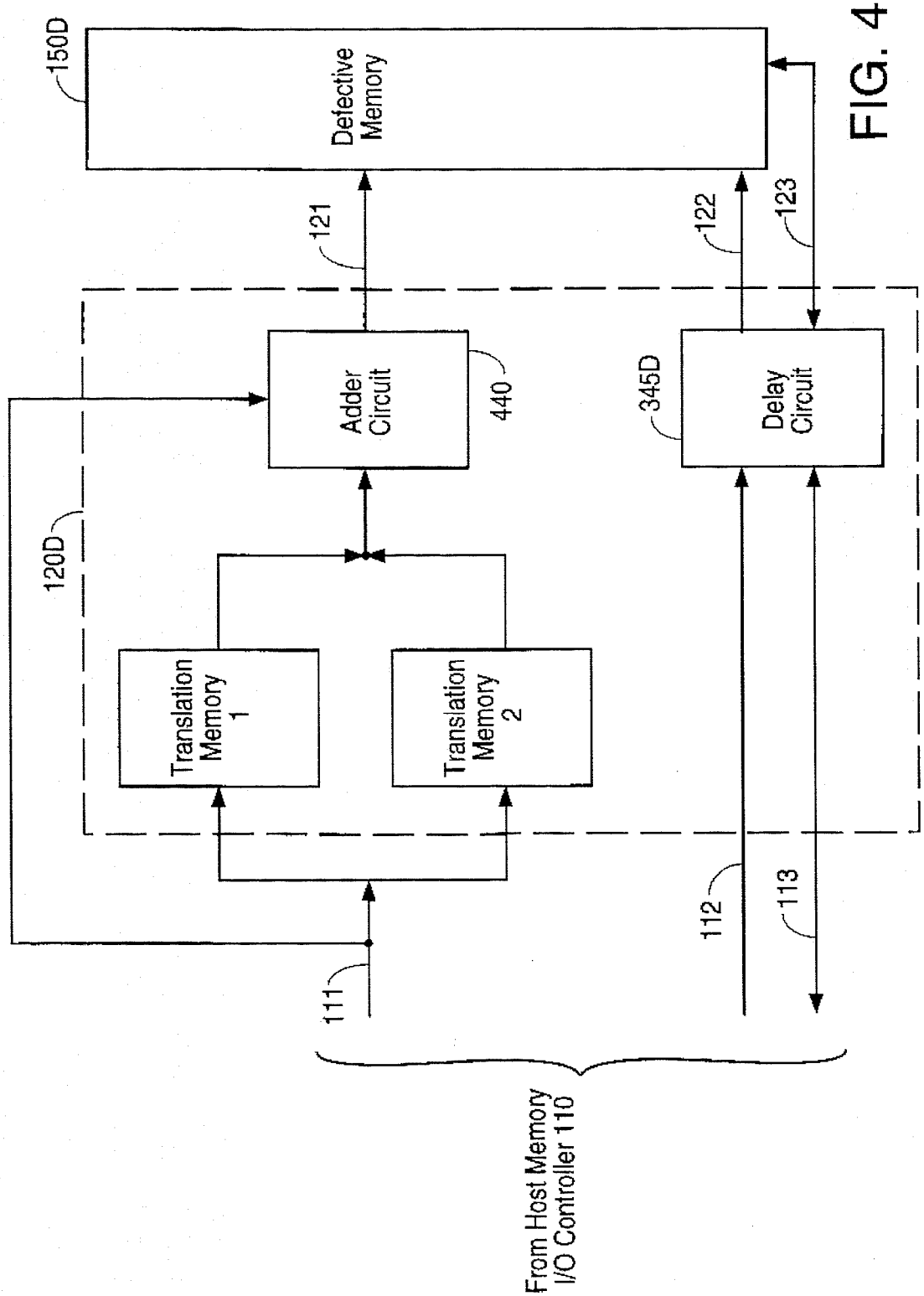

In each of the embodiment illustrated in FIGS. 4A to 4C, the information on translated address bus 121, delayed data bus 123, and delayed control lines 122 can either be applied directly to the defective memory as shown in the figures, or alternatively to a controller that in turn drives the defective memory. For example, if the defective memory is static memory, a DRAM memory controller 370 is not needed. Conversely, if the defective memory is DRAM, a DRAM memory controller used as illustrated in FIG. 3.

Hence, while the invention has been described in terms of a memory card embodiment, those skilled in the art will appreciate that the principles of the invention can be used in any device that uses a semiconductor memory. Consequently, unrepairable defective semiconductor memory can now be widely utilized. Moreover, the principles of the invention can be used in a wide variety of configurations as described herein based on cost and speed performance. Therefore, the embodiments described herein are illustrative only and are not intended to limit the invention to the specific embodiments described.

We claim:

1. An apparatus comprising:
  a readable and writable memory having:
    at least one permanent unrepairable defective region;
    a plurality of memory address terminals; and
    a plurality of memory data terminals;
      wherein information is stored in said readable and writable memory by applying an address for a location in said readable and writable memory to said memory address terminals;
  a host memory I/O controller wherein said memory controller generates an address for writing information to or retrieving information from said readable and writable memory; and
  a hardware defective memory address translation circuit having a plurality of input address terminals connected to receive said address from said host memory I/O controller, and coupled to said memory address terminals wherein said hardware defective memory address translation circuit maps said address to a translated address, and further wherein said translated address specifies a location in said readable and writable memory that is not defective.

2. An apparatus as in claim 1 wherein said hardware defective memory address translation circuit further comprises:
  a translation memory having:
    a plurality of output terminals;
    a plurality of input terminals connected to receive said address from said host memory I/O controller; and
    a mapping address table;
      wherein in response to said address on said plurality of input terminals, a mapping address from said mapping address table is applied to said plurality of translation memory output terminals.

3. An apparatus as in claim 2 wherein said translation memory output terminals are connected to said readable and writable memory.

4. An apparatus as in claim 2 wherein said translation memory is a non-volatile memory.

5. An apparatus as in claim 4 wherein said non-volatile memory is a flash EEPROM.

6. An apparatus as in claim 2 wherein said hardware defective memory address translation circuit further comprises:
  an adder circuit having:
  a first plurality of terminals connected to output terminals in said plurality of translation memory output terminals;
  a second plurality of terminals connected to input addresses terminals in said plurality of hardware defective memory address translation circuit input address terminals; and
  a plurality of output terminals;
    wherein said adder circuit generates a plurality of bits of said translated address on said plurality of adder circuit output terminals.

7. An apparatus as in claim 6 wherein said readable and writable memory is dynamic random access memory.

8. An apparatus as in claim 6 further comprising:
  a DRAM memory controller having a plurality of input terminals connected to said plurality of adder circuit output terminals, and a plurality of output terminals connected to said plurality of memory address terminals.

9. An apparatus as in claim 8 wherein said hardware defective memory address translation circuit further comprises:
  a delay circuit having a first plurality of data terminals connected to a data bus driven by said host memory I/O controller and a second plurality of data terminals connected to another plurality of input terminals of said DRAM controller.

10. An apparatus as in claim 6 said hardware defective memory address translation circuit further comprises:
  a delay circuit having a first plurality of data terminals connected to a data bus driven by said host memory I/O controller and a second plurality of data terminals connected to said plurality of memory data terminals.

11. In an apparatus, a defective memory circuit comprising:
  a readable and writable memory having:
    at least one permanent unrepairable defective region;
    a plurality of memory address terminals; and
    a plurality of memory data terminals;
      wherein information is stored in said readable and writable memory by applying an address for a location in said readable and writable memory to said memory address terminals;
  a hardware defective memory address translation circuit having a plurality of input address terminals to receive an address from a host memory I/O controller, and coupled to said memory address terminals wherein said hardware defective memory address translation circuit maps said address to a translated address, and further wherein said translated address specifies a location in said readable and writable memory that is not defective.

12. An apparatus as in claim 11 wherein said hardware defective memory address translation circuit further comprises:
  a translation memory having:
    a plurality of output terminals;
    a plurality of input terminals to receive said address from said host memory I/O controller; and
    a mapping address table;
      wherein in response to said address on said plurality of input terminals, a mapping address from said mapping address table is applied to said plurality of translation memory output terminals.

13. An apparatus as in claim 12 wherein said translation memory output terminals are connected to said readable and writable memory.

14. An apparatus as in claim 12 wherein said translation memory is a non-volatile memory.

15. An apparatus as in claim 14 wherein said non-volatile memory is a flash EEPROM.

16. An apparatus as in claim 12 wherein said hardware defective memory address translation circuit further comprises:

an adder circuit having:

a first plurality of terminals connected to output terminals in said plurality of translation memory output terminals;

a second plurality of terminals connected to input addresses terminals in said plurality of hardware defective memory address translation circuit input address terminals; and a plurality of output terminals;

wherein said adder circuit generates a plurality of bits of said translated address on said plurality of adder circuit output terminals.

17. An apparatus as in claim 16 wherein said readable and writable memory is dynamic random access memory.

18. An apparatus as in claim 17 further comprising:

a DRAM memory controller having a plurality of input terminals connected to said plurality of adder circuit output terminals, and a plurality of output terminals connected to said plurality of memory address terminals.

19. An apparatus as in claim 17 wherein said hardware defective memory address translation circuit further comprises:

a delay circuit having a first plurality of data terminals to receive data from said host memory I/O controller and a second plurality of data terminals connected to another plurality of input terminals of said DRAM controller.

20. A apparatus comprising:

a readable and writable memory having:

at least one permanent unrepairable defective region;

a plurality of memory address terminals; and a plurality of memory data terminals;

wherein information is stored in said readable and writable memory by applying an address for a location in said readable and writable memory to said memory address terminals;

a host memory I/O controller wherein said memory controller generates an address for writing information to or retrieving information from said readable and writable memory;

a translation memory having:

a plurality of output terminals;

a plurality of input terminals connected to receive said address from said host memory I/O controller; and a mapping address table;

wherein in response to said address on said plurality of translation memory input terminals, a mapping address from said mapping address table is applied to said plurality of translation memory output terminals;

an adder circuit having:

a first plurality of terminals connected to output terminals in said plurality of translation memory output terminals;

a second plurality of terminals connected to receive a predetermined number of bits in said address from said host memory I/O controller; and a plurality of output terminals;

wherein said adder circuit generates a plurality of bits of said translated address on said plurality of adder circuit output terminals;

a DRAM memory controller having a plurality of input terminals connected to said plurality of adder circuit output terminals, and a plurality of output terminals connected to said plurality of memory address terminals; and a delay circuit having a first plurality of data terminals connected to a data bus driven by said host memory I/O controller and a second plurality of data terminals connected to another plurality of input terminals of said DRAM memory controller.

* * * * *